(12) United States Patent
Ando

(10) Patent No.: US 6,560,142 B1
(45) Date of Patent: May 6, 2003

(54) CAPACITORLESS DRAM GAIN CELL

(76) Inventor: Yoshiyuki Ando, Nishi 3-2-62, Kunitachi-shi, Tokyo 186-0005 (JP)

( * ) Notice: Subject to any disclaimer, the term of this patent is extended or adjusted under 35 U.S.C. 154(b) by 0 days.

(21) Appl. No.: 10/063,119

(22) Filed: Mar. 22, 2002

(51) Int. Cl.⁷ .............................................. G11C 11/34
(52) U.S. Cl. ....................... 365/177; 365/181; 365/182; 365/230.05; 365/185.01
(58) Field of Search ............................... 365/177, 181, 365/182, 230.05, 185.01

(56) References Cited

U.S. PATENT DOCUMENTS 5,784,311 A * 7/1998 Assaderaghi et al. ....... 365/150
6,111,778 A * 8/2000 MacDonald et al. ........ 365/149

* cited by examiner

Primary Examiner—Michael S. Lebentritt
Assistant Examiner—Toan Le
(74) Attorney, Agent, or Firm—Richard D. Fuerle

(57) ABSTRACT

A nondestructive read, two-device gain cell for a DRAM memory, based on conventional complementary metal oxide technology is disclosed. The charge is stored on the gate of a first MOSFET, with a second MOSFET connected to the gate for controlling the charge in accordance with an information bit. Depending on the stored charge, the surface under the gate of the first MOSFET is in a depletion or weak inversion condition. For both conditions, the first MOSFET is "off-state." The first MOSFET causes a bipolar current flow when it is in a weak inversion condition, due to a "read" forward bias of the source to body junction. The bipolar current substantially depends on current gain, thereby multiplying the effective charge read from the first MOSFET.

19 Claims, 3 Drawing Sheets

CAPACITORLESS DRAM GAIN CELL

BACKGROUND OF INVENTION

This invention relates to a capacitorless dynamic random access memory (DRAM) gain cell. In particular, it relates to a self-amplifying large-scale DRAM memory cell that has ultra-high integration density, two field effect transistors, and requires no charge storage capacitor.

The continuing movement of integrated circuit technology toward smaller scales is making system level integration on a chip both possible and desirable. A system level integration generally merges, on a single chip, memory and logic functions. DRAM cells are attractive for such merged system integrations because DRAM cells occupy a small area, and thereby potentially allow a large number of memory cells to be integrated with logic functions. However, even with DRAMs, merging memory and logic involves problems with process complexity and cost. For example, merging conventional DRAMs with logic, using either stacked or trench capacitor cells, is very complex and costly for several reasons. One reason is that logic is frequently performance driven and, when seeking a compromise between cost and performance, the latter may be favored. DRAMs, on the other hand, are frequently cost driven due, in large part, to the sheer number of such devices used in many commercial systems. Another reason is that deep trench technology, as used for DRAM cells, is not preferred for implementing logic. Still another reason is that stacked capacitor technology, which is a conventional DRAM technology, causes problems with the lithography of standard logic processes, due to its non-planar topography.

One possible solution is to use static random access memories (SRAMs), which can be easily integrated with complementary metal oxide semiconductor (CMOS) logic. SRAM cells, however, are not area efficient. Thus, there is a need for a memory cell that occupies a very small area, yet does not require extra processing for integration with the logic, especially large capacitor.

SUMMARY OF INVENTION

An object of the present invention is to provide a high performance, area-efficient memory cell that can be fabricated by conventional CMOS technology, without the need for special process or structural modifications. Moreover, an object of the present invention is to avoid either stacked capacitor or deep trench storage and, instead, to employ standard devices available in high performance CMOS logic technology.

Another object of the invention is to provide a high performance, area-efficient memory cell that can use conventional CMOS voltage levels, thereby facilitating merged system level integration.

Pursuant to these and other objectives, one embodiment of the present invention comprises a storage metal oxide semiconductor field effect transistor (MOSFET), which stores information, and an access MOSFET, which controls the charging and discharging of the gate of the storage MOSFET for writing information. The access MOSFET turns on in response to a write control signal connected to its gate. When the access MOSFET is turned on, a write information signal, representing either a logical "0" or logical "1," passes through that access MOSFET to the gate of the storage MOSFET. The storage MOSFET is thereby charged to a weak inversion condition or to a depletion (or even majority carrier accumulated) condition in accordance with the write information signal.

To read information, the access MOSFET is turned off and the storage MOSFET is "off-state" because in weak inversion and depletion conditions a conductive channel is not induced at the surface of the storage MOSFET so a current does not flow across the channel. A read control signal connected to the body of the storage MOSFET is applied with a forward bias to the source. The resulting drain current of the storage MOSFET depends upon its gate charge condition, thereby indicating the state of the stored information.

A significant and novel feature of the present invention is that when the storage MOSFET is in a weak inversion charge state, the forward bias of the body at the source junction causes a large bipolar drain current. A current gain for bipolar action depends on the condition of the surface of the body. In a weak inversion condition, the current gain is larger than it is in the depletion condition.

A further embodiment of the present invention is using a different type of MOSFET for the access MOSFET and the stored MOSFET. This results in a one word line and a one bit line circuit.

Yet a further embodiment of the present invention is a method of operating a MOSFET where a constant voltage below but close to the threshold voltage is applied to the gate to place its surface in a depletion or a weak inversion condition and to input a forward signal bias from the body to the source junction, which causes a large bipolar drain current. A current gain for bipolar action depends on the forward signal current.

DETAILED DESCRIPTION

It will be understood from this description that the present invention can be implemented in conventional MOSFET technology, and that the described embodiments will operate accordingly if designed and fabricated in accordance with known CMOS and SOI (silicon on insulator) rules and methodologies. These rules and methodologies are well-known in the art and will not be repeated for this description. SOI materials meeting this criterion are well known in the art.

Figure 1:
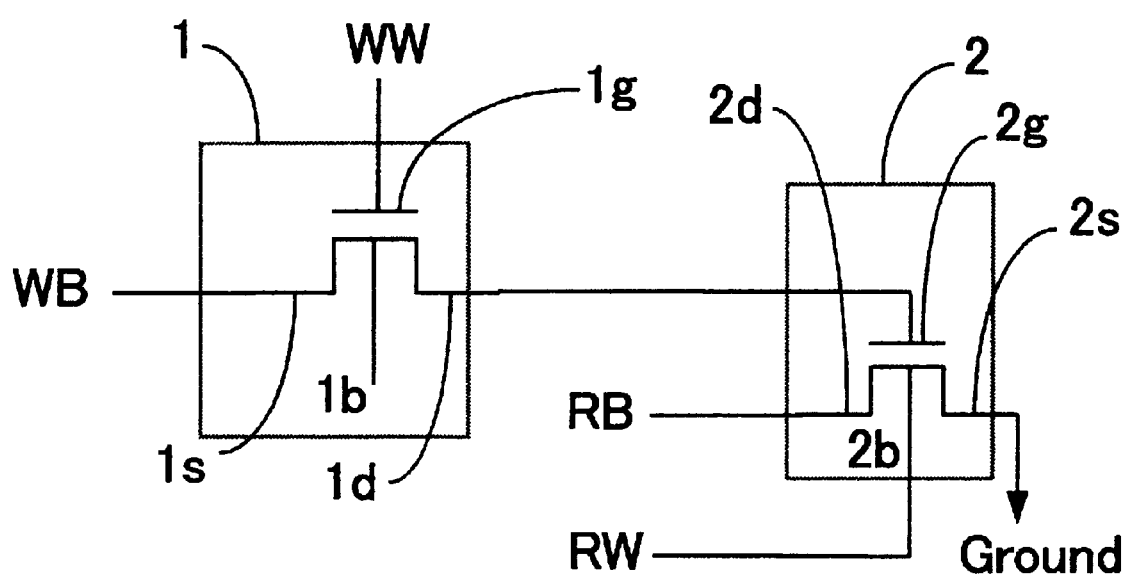
FIG. 1 is a diagram illustrating a certain presently preferred embodiment of a dynamic memory cell according to this invention.

Referring to the drawings, and more particularly to FIG. 1, there is shown, by schematic, an example of an embodiment of a memory cell according to the present invention. A storage MOSFET transistor 2, has a gate 2g, a source 2s, a drain 2d, and a body (substrate) 2b, and an access MOSFET transistor 1, has a gate 1g, a source 1s, a drain 1d, and a body 1b. As will be understood, diffusion regions 1s and 1d function either as a source or a drain, according to the direction of the current therethrough.

For this embodiment, the storage transistor 2 is a MOSFET of one conductivity type, i.e., either NFET (N-channel Field Effect Transistor) or PFET (P-channel Field Effect Transistor), and the access transistor 1 is of the same conductivity type, i.e., either both NFET or both PFET. For this particular example, the access transistor 1 and the storage transistor 2 are both NFET.

As described below, the storage transistor 2 stores a logical "0" and a logical "1" by being charged, through the access transistor 1, to a depletion condition or to a weak inversion condition, respectively. The storage transistor 2 holds the charge by its gate 2g being held at the gate voltage for of a logical "0" or a logical "1." The control signals connected to the transistors 1 and 2, which effect the charging, discharging, and reading of the depletion condition, are the read word signal, labeled as RW, the read bit/precharge signal, labeled as RB, the write word signal, labeled as WW, and the write bit signal, labeled as WB.

For this description, a weak inversion condition represents a logical "1", and a depletion condition represents a logical "1." This definition is, of course, an arbitrary design choice. When storage transistor 2 contains a logic "1" its voltage is close to but below its threshold voltage and the surface under gate 2g is in a weak inversion condition. In this condition, current does not pass from source 2s to drain 2d. A read operation begins when a Read Word line (RW) signal is applied to the body-to-source junction (PN junction) which becomes forward biased. This condition will precipitate an inherent bipolar current flow whose magnitude is proportional to the conditions on the surface of the body of the storage transistor 2, multiplied times the current gain (beta value) of the inherent bipolar transistor (i.e., storage transistor 2). When storage transistor 2 contains a logic "0," its voltage is far from the threshold voltage of storage transistor 2 and the surface under gate 2g is in a depletion condition. In this condition, the bipolar current is small. In this manner, the effective value of the gate charge, in terms of the magnitude of the discharge current sensed at the Read Bitline (RB), is enhanced by this parasitic bipolar effect.

Figure 2:
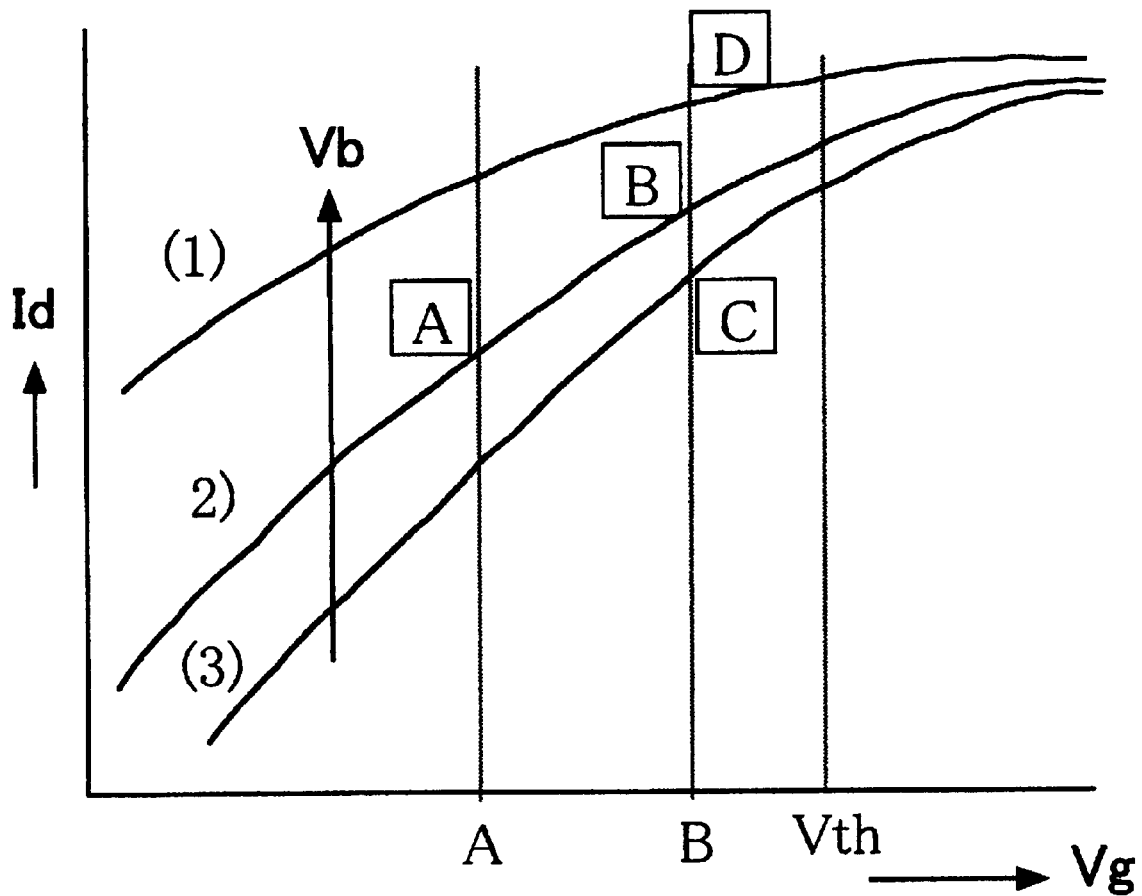
FIG. 2 is a graph illustrating the relationship between Vg and Id as a parameter of Vb

FIG. 2 shows the relationship between the gate voltage (Vg) and the drain current (Id) as a parameter of body bias (Vb) for a conventional MOSFET. When Vg is applied at A volts, Id is very small and the surface condition under the gate is in a depletion condition, which means that the surface is charged the same type as the body. When Vg is B volts, Id is larger than in the case of A volts. In this condition, the surface is in a weak inversion condition and the charge of the surface is still a majority carrier, which means that it is the same type as the body, but the ratio between the majority and the minority carriers becomes small. And when Vg is Vth (the threshold voltage), Id is much larger and the surface condition become inverted completely, which means that the charge on the surface is the same type as the source and the drain.

Parameters (1), (2), and (3) show forward bias conditions of the body-to-source junction (PN junction). (1) is the nearly built-in voltage of a PN junction, about 0.65V, (2) is about 0.4 to about 0.5V , and (3) is the bias at 0V. Experimental data can be found in FIG. 11 on pages 414 to 429 of IEEE Transactions On Electron Devices, Vol. 44, No.3, March 1997, "Dynamic Threshold-Voltage MOSFET (DTMOS) for Ultra-LOw Voltage VLSI." According to this paper, at Vb=0.5V and Vg=0V, A is 2 nA , at Vb=0.5V and Vg=0.5V, B is 5 uA. As another example, In FIG. 5 of IEEE Transactions On Electron Devices, Vol. 45, No.5, May 1998, pages 1000 to 1009, "Approaches to Extra Low Voltage DRAM Operation by SOI-DRAM," shows that A is 2 nA at Vb=0.5V, Vg=0V, and B is 20 uA at Vb=0V and Vg=0.5V. Thus, the difference in voltage between "0" and "1" is more than 2 digits. From these data, a conventional MOSFET acts as a storage charge detector in this manner. As that sensitiveness is superior to the current MOSFET operation mode, this invention is applicable to other memory-like conventional floating gate non-volatile memory cells, MONOS (Metal Oxide Nitride Oxide Semiconductor), such as local storage type non-volatile memory cells and the pair input transistors of differential amplifiers.

In the above explanation of FIG. 2, Vb was constant and Vg was variable, but it is also possible for Vg to be constant and Vb to be variable, which is more sensitive than conventional MOSFET operations. This example is shown in FIG. 2, where Vg is the constant B volt and Vb is changed from C to D volts as an input signal. In FIG. 5 of IEEE Transactions On Electron Devices, Vol. 45, No.5, May 1998, pages, 1000 to 1009, at Vg=0.5V and Vb=−0.5V, Id=0.5 uA. At Vg=0.5V and Vb=+0.5V, Id=20uA In addition, the gate oxide thickness doesn't need to follow the scaling law of its gate length shrink.

While the actual voltages used will vary with the particular devices, preferably storage transistor 2 has a forward bias voltage of about 0.3 to about 0.6 volts, a depletion voltage of about 0 to about 0.3 volts, and a weak inversion voltage of about 0.7 to about 1.0 volts.

Figure 3:
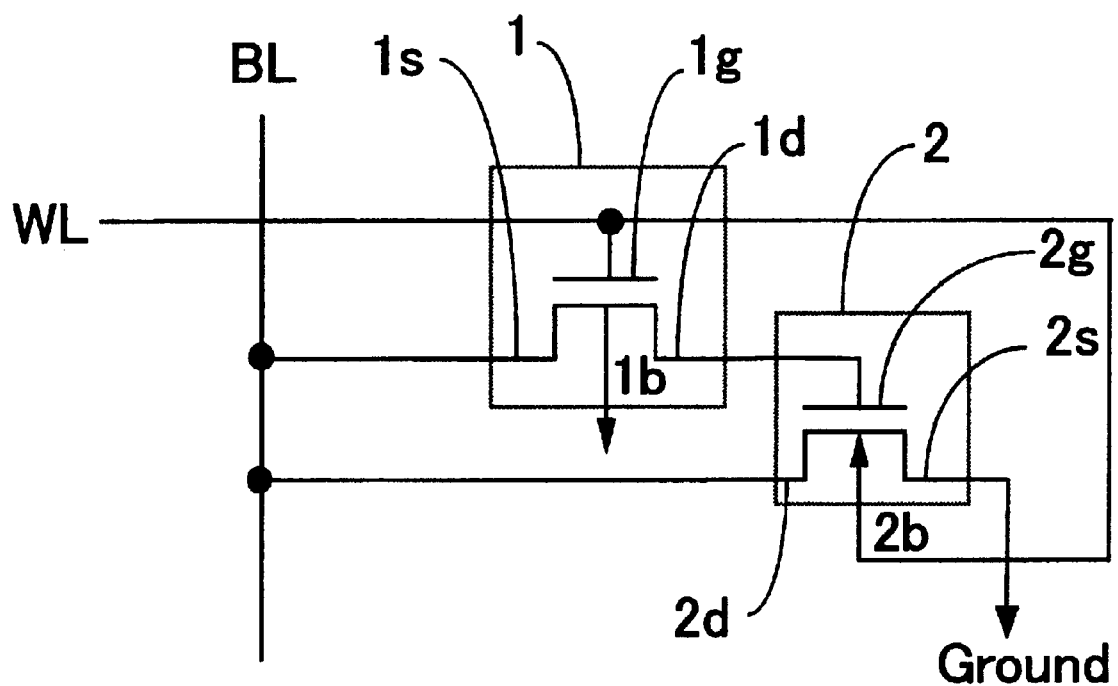
FIG. 3 is a diagram illustrating another certain presently preferred embodiment of a dynamic memory cell according to this invention.

In FIG. 3, the storage transistor 2 is a MOSFET of one conductivity type, i.e., either NFET or PFET, and the access transistor 1 is a different conductivity type, i.e., either PFET or NFET. WW and RW are one line WL (Word Line). WB and RB are tied one line BL (Bit Line). This operates to write data when WL becomes a negative voltage. Access transistor 1 then becomes active and write data from BL is charged to the gate of storage transistor 2. During this time, the body-source of storage transistor 2 is reversed-biased. To read data, WL becomes a positive voltage, then the body-source of the storage transistor 2 is forward-biased. According to this embodiment, the voltage level of the BL depends on the gate charge of the storage transistor. At this time, access transistor 1 is off-state.

The present invention is also useful when implemented utilizing SOI technology. However, any technology which allows bodies of transistors to be independently biased could be utilized with the present invention.

While the invention has been particularly shown and described with reference to a preferred embodiment, it will be understood by those skilled in the art that various changes in form and detail may be made therein without departing from the spirit and scope of the invention.

What is claimed is:

1. A dynamic memory cell comprising:

(A) a storage transistor having a body connected to a body terminal, a gate connected to a gate terminal, a source connected to a source terminal, and a drain connected to a drain terminal;

(B) a read-word input connected to said body terminal;

(C) a read-bit output connected to said drain terminal;

(D) an access transistor having an access drain terminal connected to said gate terminal, an access gate terminal, and an access source terminal; and (E) a write-word input connected to said access gate terminal and a write-bit input connected to said access source terminal, wherein a write-bit signal charges or discharges said gate terminal to either a depleted condition or to a weak inversion condition, which corresponds to the externally generated write bit signal in response to the write word signal, the read word signal forward biases a junction between the source and the body of said storage transistor in response, whereby said forward bias effects a bipolar current flowing into the drain of said storage transistor.

2. A dynamic memory cell according to claim 1, wherein the substrate of said storage transistor is an SOI.

3. A dynamic memory cell according to claim 1, wherein said storage transistor and said access transistor are field-effect transistors.

4. A dynamic memory cell according to claim 3, wherein the first field-effect transistor is of a first conductivity type and the second field-effect transistor is of a second conductivity type, wherein each memory cell has a single word line and a single bit line.

5. A dynamic memory cell according to claim 3, wherein the first field-effect transistor is a PFET and the second field-effect transistor is an NFET.

6. A dynamic memory cell according to claim 3, wherein the first field-effect transistor is a NFET and the second field-effect transistor is an PFET.

7. A dynamic memory cell according to claim 3, wherein the first field-effect transistor is a NFET and the second field-effect transistor is an NFET.

8. A dynamic memory cell according to claim 3, wherein the first field-effect transistor is a PFET and the second field-effect transistor is an PFET.

9. A dynamic memory cell according to claim 3, wherein said storage transistor and said access transistor are metal oxide semiconductor field-effect transistors.

10. A dynamic memory cell according to claim 9, wherein the substrate of said storage transistor is an SOI.

11. A dynamic memory cell according to claim 1, wherein said dynamic memory cell does not have a charge storage capacitor.

12. A dynamic memory cell according to claim 1, wherein said weak inversion condition represents a logical "1" and a depletion condition represents a logical "0."

13. A dynamic memory cell according to claim 1, wherein said weak inversion condition represents a logical "1" and a depletion condition represents a logical "1."

14. A dynamic memory cell according to claim 1, wherein said storage transistor has a forward bias voltage of about 0.3 to about 0.6 volts, a depletion voltage of about 0 to about 0.3 volts, and a weak inversion voltage of about 0.7 to about 1.0 volts.

15. A method of writing and reading information on a dynamic memory cell of claim 1 comprising
(A) to write information, sending a write control signal to said access gate terminal, turning on said access transistor, and sending a write information signal through said access transistor to said gate of said storage transistor; and
(B) to read information, turning off said access transistor, placing said storage transistor in an 'off-state,' sending a read control signal to said body of said storage transistor with a forward bias to the source.

16. A dynamic memory cell comprising:
(A) a storage transistor having a body connected to a body terminal, a gate connected to a gate terminal, a source connected to a source terminal, and a drain connected to a drain terminal;
(B) a word-line connected to said body terminal;
(C) a bit-line connected to said drain terminal;
(D) an access transistor having an access drain terminal connected to said gate terminal, an access gate terminal, and an access source terminal; and
(E) a word-line input connected to said access gate terminal and a bit-line connected to said access source terminal, wherein a bit-line signal charges or discharges said gate terminal to either a depleted condition or to a weak inversion condition, which corresponds to the externally generated write bit signal in response to the write word-line signal, the word-line signal forward biases a junction between the source and the body of said storage field-effect transistor in response, whereby said forward biasing causes a bipolar current to flow into said drain.

17. A non-volatile memory cell comprising:
(A) a storage transistor having a body connected to a body terminal, a floating gate, a source connected to a source terminal, and a drain connected to a drain terminal;
(B) a read-word input line connected to said body terminal; and
(C) a read-bit output line connected to said drain terminal, where said floating gate stores charges below the threshold voltage of said storage transistor to a depleted condition or to a weak inversion condition on its surface and the read word signal forward biases a junction between said source and said body in response to a read word signal, whereby a forward bias occurs which causes a bipolar current to flow into said non-volatile memory.

18. A non-volatile memory cell according to claim 17 wherein said storage transistor has a MONOS structure.

19. A MBSFET device comprising:
(A) a body connected to a body terminal, a gate connected to a gate terminal, a source connected to a source terminal, and a drain connected to a drain terminal;
(B) a signal input line connected to said body terminal; and
(C) an output line connected to said drain terminal, where voltages below the threshold voltage of said MOSFET are applied to said gate to cause a depletion condition or to a weak inversion condition for the surface of said MOSFET and the input signal forward biases a junction between said source and said body in response, whereby a forward bias occurs that causes a bipolar current to flow into said drain.

* * * * *

UNITED STATES PATENT AND TRADEMARK OFFICE
CERTIFICATE OF CORRECTION

PATENT NO.   : 6,560,142 B1
DATED        : May 6, 2003
INVENTOR(S)  : Yoshiyuki Ando It is certified that error appears in the above-identified patent and that said Letters Patent is hereby corrected as shown below:

Column 5,
Line 38, after "represents a," delete "logical "1" and" and substitute -- logical "0" and --

Column 6,
Line 40, delete "A MBSFET" and substitute -- A MOSFET --

Signed and Sealed this

Nineteenth Day of August, 2003

JAMES E. ROGAN
*Director of the United States Patent and Trademark Office*